(12) United States Patent
Laukien et al.

(10) Patent No.: US 11,630,172 B2
(45) Date of Patent: Apr. 18, 2023

(54) NMR MAGNET SYSTEM WITH STIRLING COOLER

(71) Applicant: Bruker BioSpin Corp., Billerica, MA (US)

(72) Inventors: Frank Laukien, Billerica, MA (US); Frank Decker, Gaggenau (DE)

(*) Notice: Subject to any disclaimer, the term of this patent is extended or adjusted under 35 U.S.C. 154(b) by 10 days.

(21) Appl. No.: 17/201,297

(22) Filed: Mar. 15, 2021

(65) Prior Publication Data

US 2022/0291307 A1 Sep. 15, 2022

(51) Int. Cl.
*G01R 33/34* (2006.01)
*G01R 33/46* (2006.01)

(52) U.S. Cl.
CPC ... *G01R 33/3403* (2013.01); *G01R 33/34007* (2013.01); *G01R 33/46* (2013.01)

(58) Field of Classification Search
CPC .......... G01R 33/3403; G01R 33/34007; G01R 33/46
See application file for complete search history.

(56) References Cited

U.S. PATENT DOCUMENTS

| 5,381,666 | A | * | 1/1995 | Saho | ........................ | F25B 9/10 |
| | | | | | | 62/51.1 |
| 6,192,690 | B1 | | 2/2001 | Stautner | | |
| 2005/0229620 | A1 | | 10/2005 | Kirichek et al. | | |
| 2005/0262851 | A1 | * | 12/2005 | Atrey | ........................ | F25D 19/00 |
| | | | | | | 62/51.1 |
| 2006/0026968 | A1 | * | 2/2006 | Gao | ........................ | F25D 19/006 |
| | | | | | | 62/55.5 |
| 2006/0137363 | A1 | | 6/2006 | Carr et al. | | |
| 2006/0202694 | A1 | | 9/2006 | Maeda et al. | | |

(Continued)

FOREIGN PATENT DOCUMENTS

| EP | 0720024 | A1 | | 3/1996 | | |
| GB | 2459104 | A | | 10/2009 | | |
| GB | 2591741 | A | * | 8/2021 | ......... | G01R 33/3815 |

(Continued)

OTHER PUBLICATIONS

Ben-Dove, et al., "NMR sensitivity to floor vibration," Journal of the Acoustical Society of America 123.5 (2008), pp. 3813-3813.

(Continued)

*Primary Examiner* — G. M. A Hyder
(74) *Attorney, Agent, or Firm* — Benoit & Côté Inc.

(57) ABSTRACT

An NMR magnet system uses a Stirling cooler having a cold head that extends into a housing of the system to cool a cold shield surrounding a cryogen vessel. The system may have a damper located between the cooler and the cold shield to reduce a transmission of vibration from the cooler to a magnet coil immersed in the cryogen. The damper may be passive, or may be part of an active damping system that uses an acceleration sensor to drive an active damper that compensates for cooler vibration. A compensation apparatus may use a stored characteristic of a signal distortion caused by the vibration and, in response to a trigger signal from the cooler, apply compensation to an excitation signal provided to a sample by an NMR probe in a bore of the magnet coil, or to an FID signal from the sample that is detected by the probe.

18 Claims, 6 Drawing Sheets

(56) References Cited

U.S. PATENT DOCUMENTS

2017/0051874 A1    2/2017    Strobel

FOREIGN PATENT DOCUMENTS

JP            3721382 B2    11/2005
JP            S61 93939 A   11/2005

OTHER PUBLICATIONS

Penswick, L., et al., "High-capacity and efficiency Stirling cycle cryocooler," Cryocooler, vol. 18, (2014).
Laun W. et al. "Cooling of ground based telescope instrumentation, the LINC-NIRVANA cryostat" Ground-Based Instrumentation for Astronomy, Proceeding of SPIE, vol. 5492, pp. 1725-1734 (2004).

* cited by examiner

NMR MAGNET SYSTEM WITH STIRLING COOLER

BACKGROUND OF THE INVENTION

Field of the Invention

This invention relates generally to the field of NMR magnet systems and, more specifically, to the use of active cooling with such systems.

Description of the Related Art

Nuclear magnetic resonance (NMR) magnet systems are an essential tool for biomolecular scientists. Over time, they require periodic refilling with liquid cryogens by trained personnel, and during cryogenic transfer, the NMR magnet system cannot be operated due to instrument instability. Furthermore, the cost of helium required for cooling the magnet to temperatures suitable for superconductivity tends to rise over time. To partly overcome the depletion of helium in such systems, so-called two-stage pulse tube refrigerators (PTR) have been used in recent years. A first stage is connected to a cold shield of the NMR magnet system, while a second stage with a lower temperature is thermally coupled via helium vapor to the helium vessel of the NMR magnet. PTRs provide a constant cooling power. To keep operating conditions in NMR magnet systems constant, sometimes an electrical heater for heating the helium is used.

For low-cost NMR magnet systems with an equivalent field strength of 400 or 500 MHz, active cooling of the cold shield with one stage pulse tube refrigerators may be used. These NMR magnet systems have no vessel for liquid nitrogen. A PTR used therein provides a cooling power of above 30 W at a temperature of 80 K. Due to their functional principle, PTRs require an external compressor that provides high pressure for the operation of the cold head of the PTR. Electrical power consumption of the compressor is high (in the range of several kW), and sound isolation is mandatory. Beyond that, PTRs require regular servicing of their components by trained personnel, which increases the overall cost of operation significantly. Moreover, the operating frequency of a PTR is in the range of 1-2 Hz thereby inducing mechanical vibrations into the NMR magnet system at these frequencies and at harmonics thereof. It has been shown that NMR magnet systems are especially sensitive to mechanical vibrations below 10 Hz (see, e.g., Ben-Dov, et al., "NMR sensitivity to floor vibration," *Journal of the Acoustical Society of America* 123.5 (2008), 3813-3813.). In particular, vibrations in directions perpendicular to the z-axis (the axis of the magnet bore) of an NMR magnet system induce, by a factor of ten, higher noise into an NMR signal than vibrations along the z-direction.

Stirling coolers comprise a motor driving an internal compressor along a compressor axis, and a displacer that moves along a displacer axis asynchronously with respect to the compressor. Vibrations of the Stirling cooler occur mainly in the direction of the compressor axis and the direction of the displacer axis, although these two axes may be parallel or coaxial. Different orientations for the cold head and compressor of Stirling coolers have been realized or proposed, including those with an inline compressor, those with a parallel compressor and those with a cross-oriented compressor. Low vibration setups also exist, but require a symmetric arrangement of compressors (see, e.g., Penswick, L., et al., "High-capacity and efficiency Stirling cycle cryocooler," *Cryocooler*, Vol. 18, 2014).

SUMMARY OF THE INVENTION

The above requirements and limitations demonstrate the need for a cooler for the cold shield of an NMR magnet system that carries a lower overall cost of ownership and that has a minimal effect on NMR measurements.

With the commercial availability of Stirling coolers delivering 30 W at 80K with a motor power of less than 500 Watts, shield cooling can be readily achieved. Stirling coolers have a time to failure of up to 10 years. NMR magnet systems using a Stirling cooler for cold shield cooling therefore would require nearly no servicing by trained personnel. Stirling coolers typically operate at mechanical frequencies above 10 Hz. This frequency will impact NMR measurements less than PTRs therefore leading to better results.

In accordance with the invention, a nuclear magnetic resonance (NMR) system is provided that includes a housing with a neck tube, and a helium vessel located in the housing that contains a magnet coil. A cold shield surrounds the helium vessel, and a Stirling cooler is attached to the neck tube such that a cold head of the cooler extends into the housing. The cold head is thermally connected to the cold shield via a thermal coupling.

In an exemplary embodiment, the magnet coil generates an equivalent field strength of 400 to 500 MHz. The Stirling cooler may provide, for example, a cooling power of at least 30 W at a temperature of 80 K. In one favorable embodiment, the cooler is operated at a mechanical frequency of above 10 Hz. The thermal coupling may include a flexible, thermally conductive means, in particular a set of copper-stranded wires that mechanically isolate the Stirling cooler from the cold shield. In one version of this embodiment, the wires have a stiffness and orientation that provides an elastic connection between the cooler and the cold shield that minimizes the transfer of vibration between the cooler and the cold head. In the exemplary embodiment, the NMR magnet system is a vertical NMR magnet system having a z-axis about which a room temperature bore is centered, and a compressor axis of the Stirling cooler is parallel with the z-axis.

In another embodiment the Stirling cooler is mounted on the NMR magnet system with a damper that further reduces the transmission of mechanical vibrations from the Stirling cooler to the NMR magnet system. The damper may comprise an elastic element that is deformable for passive reduction of mechanical vibrations. In another embodiment an acceleration sensor is attached to the Stirling cooler measuring the movement of the Stirling cooler. In this configuration the damper is actively driven by the signal received from the acceleration sensor to perform an opposite movement.

In yet another embodiment, an NMR magnet system is provided that includes a Stirling cooler that generates a periodic trigger signal indicative of a motion state of the Stirling cooler. For example, the trigger signal may be generated once every cycle of the cooler operation. The system may be used in an arrangement having an NMR probe that is inserted into a room temperature bore of the NMR magnet system, the probe providing an RF excitation signal to a sample in the magnet bore, and detecting a free induction decay (FID) signal from the sample. In this embodiment, a compensation apparatus is also provided that receives the trigger signal from the Stirling cooler and applies compensation to the excitation signal and/or the FID signal that counteracts the distortion.

The compensation apparatus may include a data storage element in which is stored a representation of the distortion. The excitation signal may be generated using a numerically controlled oscillator (NCO), and applying of the compensation to the excitation signal may involve providing the stored representation of the distortion as an input to the NCO. This provides an offset that cancels the distortion induced in the excitation signal. Application of the compensation to the FID signal may include inputting the FID signal to a frequency mixer together with an oscillator signal in which is incorporated the stored representation of the distortion.

DETAILED DESCRIPTION

Figure 1:
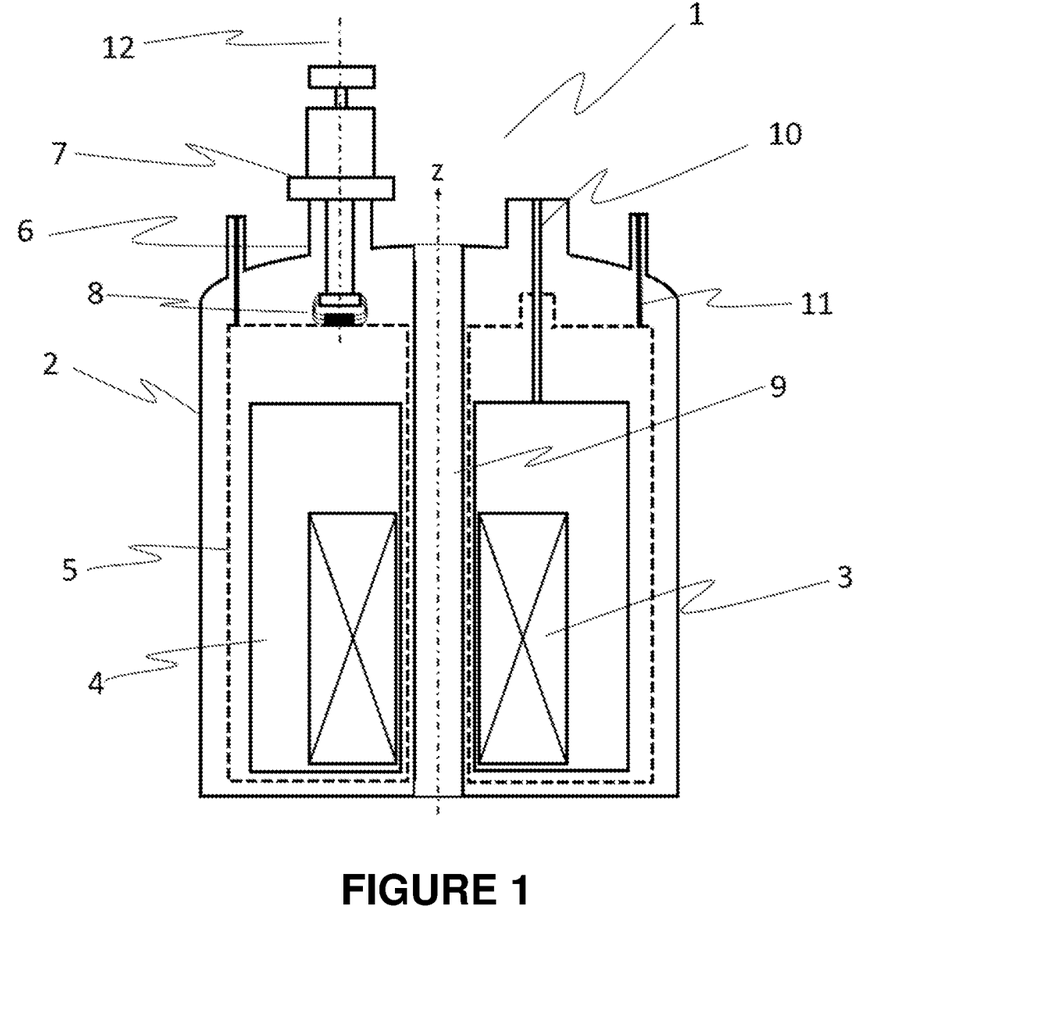
FIG. 1 shows an NMR magnet system that uses a Stirling cooler to cool a cold shield of the magnet system in accordance with the invention.

FIG. 1 shows an NMR magnet system 1 with a Stirling cooler 7. The NMR magnet system comprises a housing 2, and a magnet coil 3 in a helium vessel 4. The helium vessel is surrounded by a cold shield 5, which is fixed to the housing by holding rods 11. The helium vessel is connected to holding tube 10, which may be one of several holding tubes, and which provides a passage through which helium gas within the helium vessel 4 may pass to an external collection chamber (not shown). Holding tubes 10 are also used for connecting magnet coil 3 to an external power supply for charging the magnet, and for refilling helium in the helium vessel 4. Furthermore, they provide structural support for the helium vessel 4, helping to hold it in place relative to the housing 2. The Stirling cooler 7 is attached to a neck tube 6 of the NMR magnet system. Thermal contact between the cold shield 5 and the neck tube 6 is provided by thermal coupling 8, which also provides mechanical isolation of the Stirling cooler from the cold shield. A room temperature bore 9 along the z-axis provides access to the magnetic center of the NMR magnet system. An NMR probe with a sample (not shown) may be inserted into the room temperature bore to measure an NMR spectrum of the sample.

In operation, the housing 2, as well as the interior space surrounded by the cold shield, is evacuated. Helium vessel 4 is filled with liquid helium at a temperature of 4.2 K. By evaporation of liquid helium, cooling of the magnet coil is achieved such that it remains superconducting. Vaporized helium is collected in an external container at atmospheric pressure via a pipe (not shown) that passes through the holding tube 10. The cold shield 5 surrounding the helium vessel 4 is cooled by the Stirling cooler and is kept at a temperature below 80 K to absorb heat radiation incident on the NMR magnet system. With a cooling power of the Stirling cooler of 30 W at 80 K this configuration is suitable for 400 to 500 MHz NMR magnet systems. NMR magnet systems with a higher field strength have a higher thermal mass and, due to their bigger size, receive more heat radiation, which cannot be compensated appropriately by a 30 W Stirling cooler. The Stirling cooler 7 operates at an approximate mechanical frequency of 50 Hz. That is, the cooler goes through 50 mechanical cycles per second. The transmission of mechanical vibrations from the Stirling cooler to the NMR coil is reduced by appropriate design of the thermal coupling 8, e.g., by copper stranded wires.

The NMR magnet system 1 is sensitive to mechanical vibrations, as any variation of the magnetic field at the location of a sample in the room temperature bore 9 results in a variation of the measured NMR signal. Despite mechanical isolation by the thermal coupling 8, 50 Hz vibrations may still be transmitted to the magnet coil resulting in a 50 Hz variation of the magnetic field at the location of a sample in the room temperature bore 9. Harmonics of NMR signal lines might be generated at multiple frequency spacings of 50 Hz relative to the original signal line, thereby distorting the measured spectrum by artifacts. A big advantage of using a 50 Hz Stirling cooler is that NMR magnet systems are less sensitive to external mechanical vibrations above 10 Hz. PTRs generate harmonics in the range of multiples of 1 Hz, which have a higher impact on an NMR signal, making it more difficult to decouple the PTR from the magnet coil and an NMR probe inserted into the room temperature bore 9.

Due to lower vibration sensitivity of vertical NMR magnet systems along the z-axis, it is advantageous to orient the Stirling cooler axis 12 parallel with the z-axis of the NMR magnet system, as shown in FIG. 1. In the present embodiment, the Stirling cooler axis 12 corresponds to the axis along which the compressor of the cooler reciprocates, and may also correspond to the axis along which the displacer of the cooler moves. For Stirling coolers with multiple compressors, this alignment is less important, provided the compressors are arranged symmetrically with respect to the cold head and act in a synchronized manner.

The Stirling cooler allows for slight adjustment of its operating frequency without significantly changing the cooling power. In this way, a vibrational resonance of the NMR magnet system can be avoided, such as by changing the cooler operating frequency to be further from any resonant frequency of the magnet system, or any harmonics thereof, e.g., by changing the cooler operating frequency from 50 Hz to 48 Hz. The system described herein may be used with NMR magnet systems having a vertical room temperature bore (as shown in the figure), as well as with NMR magnet systems having a horizontal room temperature bore.

Figure 2:
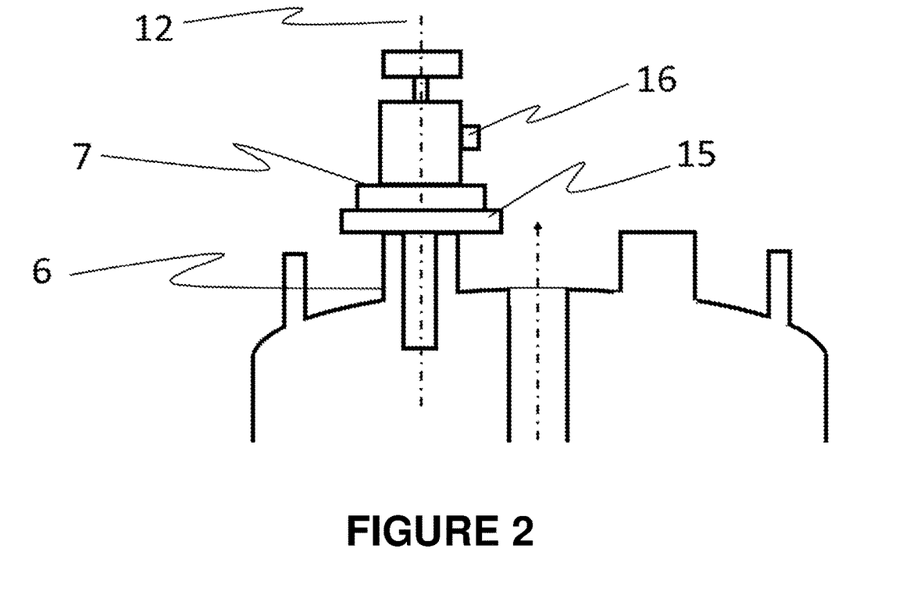
FIG. 2 shows details of the mounting of the Stirling cooler to the NMR magnet system.

FIG. 2 shows details of the mounting of the Stirling cooler in a particular embodiment of the invention. A damper 15 is inserted between the NMR magnet system and the Stirling cooler 7. In a first variant, the damper comprises an elastic element that is deformable for passive reduction of mechanical vibrations. In a second variant an acceleration sensor 16 is attached to the Stirling cooler 7 and measures its movement relative to the magnet system. In this variant, the damper 15 is actively driven by the signal received from the acceleration sensor to perform an opposite movement that compensates for the initial relative movement.

Figure 3A:
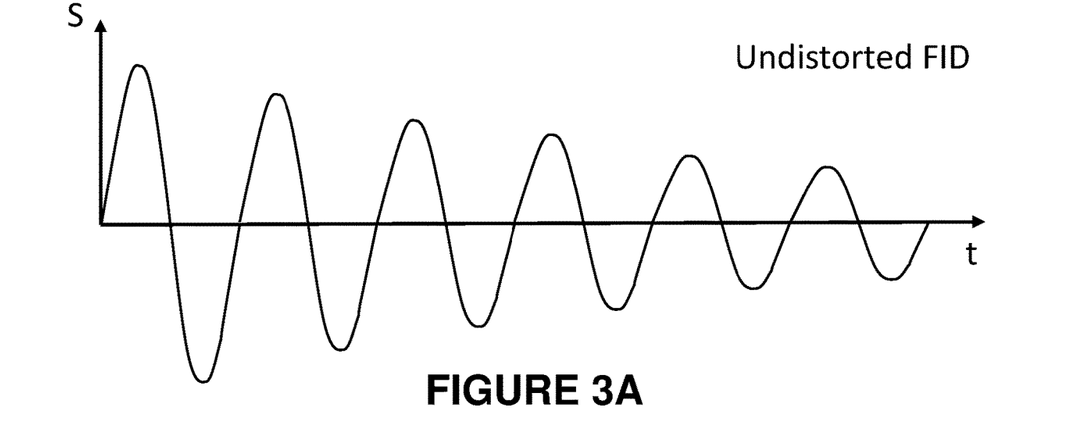
FIG. 3A is a graphical depiction of a free induction decay (FID) signal from an NMR probe with no distortion.
Figure 3B:
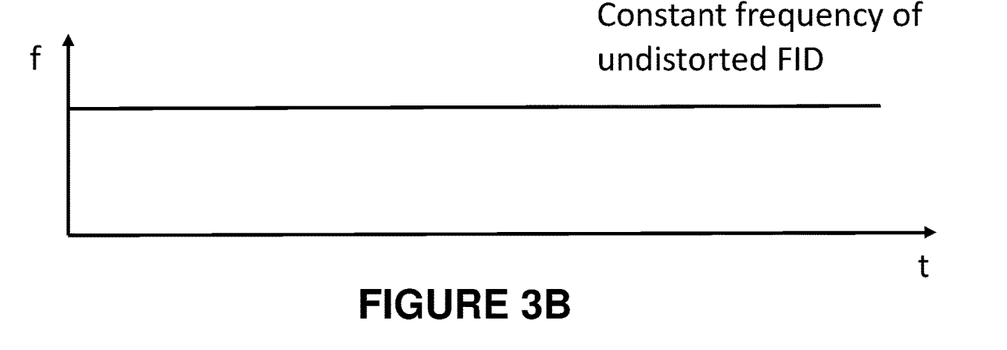
FIG. 3B is a graphical depiction showing the constant frequency of an undistorted FID signal like that shown in FIG. 3A.
Figure 4A:
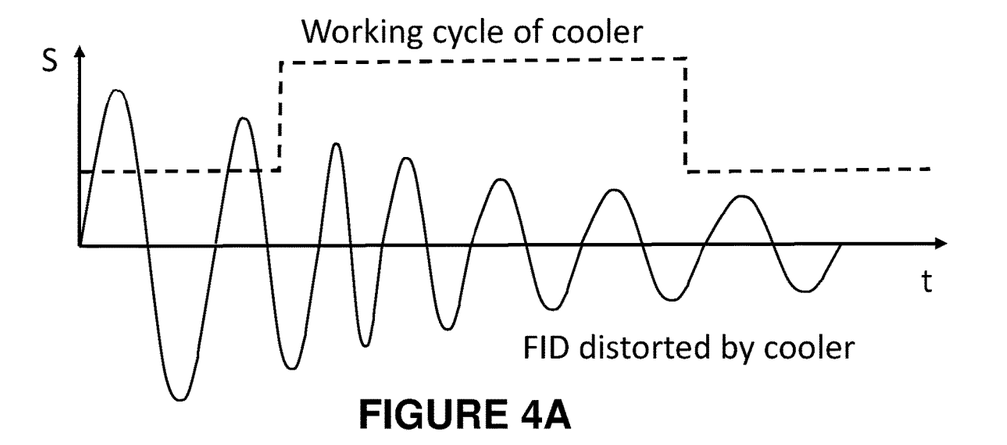
FIG. 4A is a graphical depiction of an FID signal that has been distorted by vibration from the operation of a Stirling cooler.
Figure 4B:
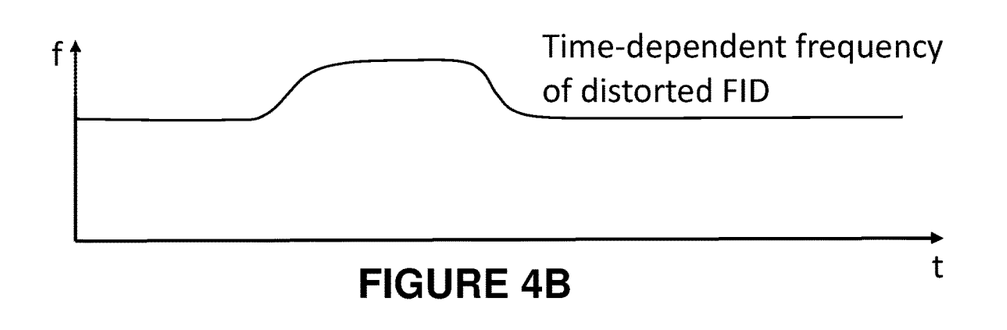
FIG. 4B is a graphical depiction showing the distorted frequency characteristic of an FID signal like that shown in FIG. 4A.

In an alternative embodiment of the invention, the effect that a cooler such as Stirling cooler 7 has on an NMR spectrometer is compensated for directly in the signals used with the spectrometer. FIG. 3A shows an undistorted free-induction decay (FID) output signal from an NMR spectrometer. The phase evolution of a single frequency is given by a linear slope over time, the derivative of which corresponds to a constant frequency as shown in FIG. 3B. This is indicative of the stable magnetic field seen by the sample. However, the operation of the Stirling cooler 7 may have a distortion effect on the NMR signal, as shown in FIG. 4A. In that figure, the working cycle of the cooler is shown in broken lines and overlaid with the FID signal. The operation of the cooler causes a distortion that manifests itself as a deviation in the phase evolution of the FID signal relative to the linear slope of the undistorted signal. The phase evolution over time can be represented as a change in frequency relative to time, as shown in FIG. 4B.

To address this error, the measured frequency distortion characteristic may be used to adjust the frequency of the NMR excitation signal to compensate for the distortion effect. The frequency distortion characteristic can preferably be measured with a narrowband NMR sample, i.e., a sample with one single and sharp resonance line (equivalent to a long FID) and with a high signal-to-noise ratio (e.g., $H_2O$ typically mixed with $D_2O$). In particular, the distortion characteristic may be stored in a look-up table and used to effect a corresponding change in the frequency of the NMR pulse sequence being used, as well as in the downmixing of the detected FID signal.

Figure 5:
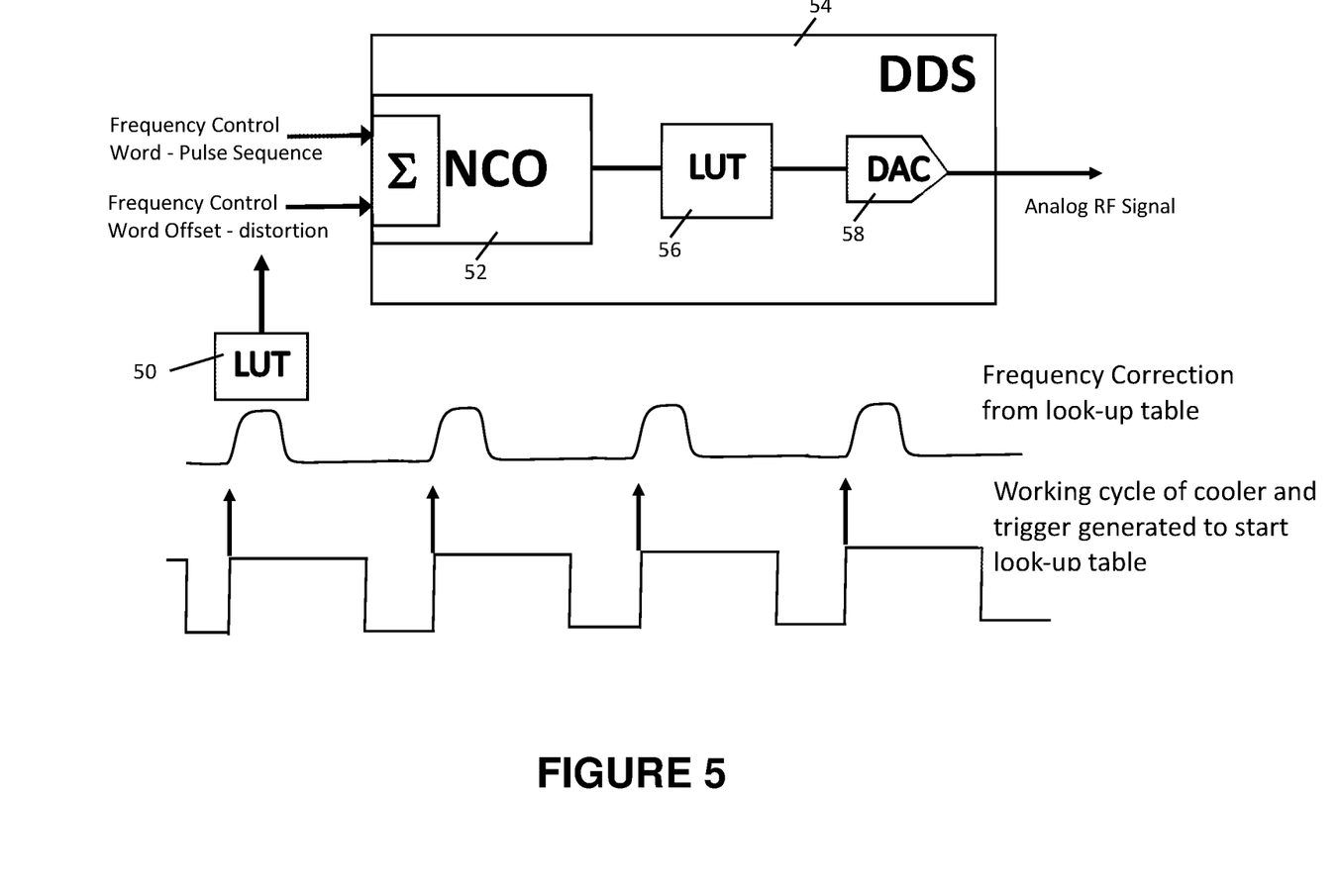
FIG. 5 is a schematic depiction of an analog RF signal generation in which a distortion characteristic due to cooler operation is incorporated into the RF signal from a look-up table.

Shown in FIG. 5 is a schematic diagram showing the operational periodicity of a Stirling cooler along the bottom portion of the figure. At the start of each cooler cycle, the cooler sends a trigger signal to the NMR spectrometer, which is used to output a digital representation of the frequency correction from the lookup table 50 in which it is stored. This value (referred to as a "frequency control word") is input to the numerically controlled oscillator (NCO) 52 of a digital direct synthesizer (DDS) 54, together with a frequency control word representative of the desired pulse sequence for the spectrometric analysis of the sample. From the combined inputs of the two control words, the NCO 52 generates a data stream of digital information which represents the desired RF pulse sequence, but with the altered phase evolution caused by the frequency distortion. The DDS 54 converts the data from the NCO 52 to an analog RF signal by means of a sine wave look-up table (LUT) 56 and a digital-to-analog converter (DAC) 58, along with appropriate filters (not shown).

Figure 6:
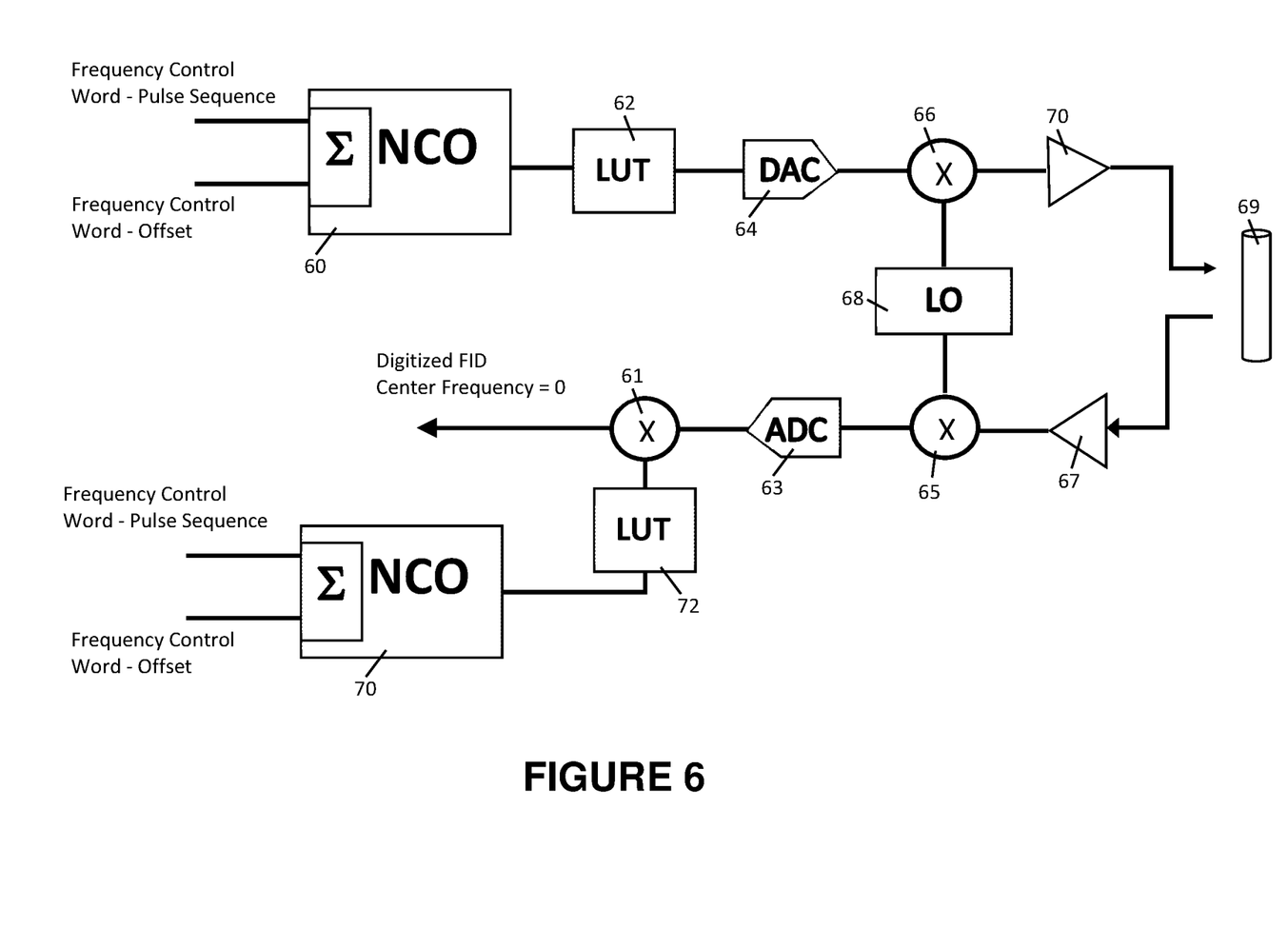
FIG. 6 is a schematic depiction of a distortion compensation apparatus that may be used to compensate for the presence of distortion due to cooler operation in an NMR probe excitation signal and in a detected FID signal.

A schematic diagram of the overall system is shown in FIG. 6. The upper portion of the figure shows NCO 60, which operates in the same manner as NCO 52 of FIG. 5. The sine wave look-up table 62 and DAC 64 output an analog frequency signal representative of the desired RF pulse sequence, as altered by the frequency distortion. However, in modern NMR spectrometers, the detection frequencies are very high and cannot be generated by an DAC directly. Thus, the DAC 64 output is input to mixer 66 together with an output frequency of a local oscillator (LO) 68. This mixing step up-converts the low frequency analog signal to an analog RF signal that is amplified in amplifier 70 and used to excite a sample located in the magnet bore 69 of the spectrometer.

The FID signal from the sample is detected and amplified by amplifier 67. This high frequency signal is then input to mixer 65 together with the output of LO 66 to mix it down a much lower frequency accessible to ADC conversion. This lower frequency FID signal is then digitized by analog-to-digital converter (ADC) 63 and directed to digital mixer 61, which receives as its other input a digital low frequency signal generated by NCO 70 and sine wave LUT 72. This digital mixing step reduces the low frequency digital FID signal to zero frequencies. However, since the FID signal also contains the frequency distortion, the down-mixing is done with the output of NCO 70 which, like NCO 60, has the offset signal generated by the frequency distortion as one of its inputs. Because of the presence of this offset in the low frequency signal from the NCO, the mixer output is a zero frequency FID signal from which the effects of the frequency distortion have been removed.

Figure 7A:
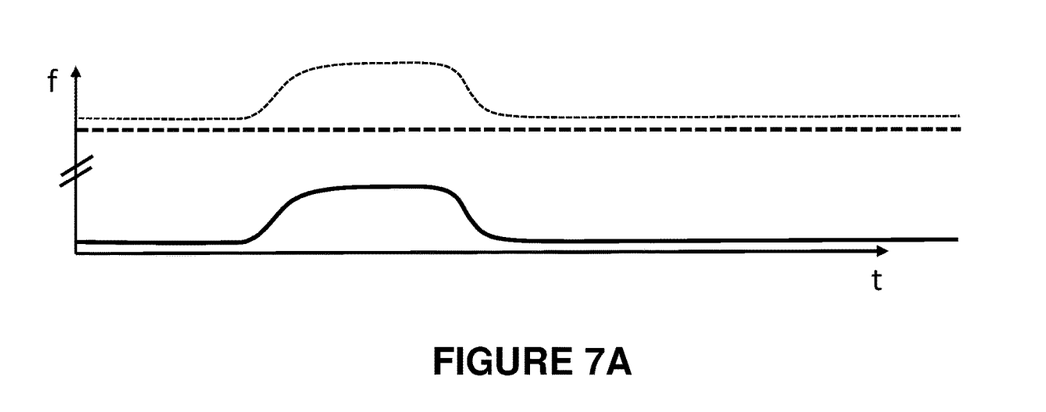
FIG. 7A is a graphical depiction of the frequency characteristic of a signal having distortion due to cooler operation, and the result of mixing such a signal with a constant frequency mixing signal.
Figure 7B:
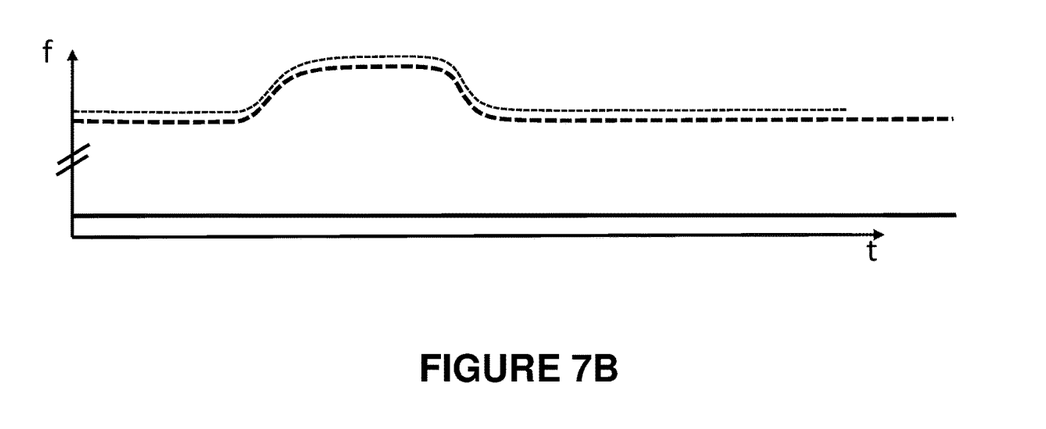
FIG. 7B is a graphical depiction of the frequency characteristic of a signal having distortion due to cooler operation, and the result of mixing such a signal with a mixing signal into which the distortion characteristic has been introduced.

The effects of the mixing done for both the excitation signal and the FID signal is demonstrated by FIGS. 7A and 7B, each of which shows the resulting frequency versus time characteristic after mixing two different signals. In FIG. 7A, the signal of interest (either the excitation signal or the FID signal) is shown as a dotted line, which is shown having a frequency distortion caused by cooler operation. In this example, the mixing signal is depicted by the dashed line, and is a constant frequency. As a result, the output signal, shown by the solid line, also displays the frequency distortion. A similar depiction is provided in FIG. 7B, for which the signal of interest (dotted line) again has the frequency distortion but, in this example, the mixing signal (dashed line) is provided with the same frequency distortion. As a result, the output signal (solid line) shows no frequency distortion.

The invention claimed is:

1. A nuclear magnetic resonance (NMR) magnet system comprising:
   a housing with a neck tube;
   a helium vessel located in the housing and containing a magnet coil immersed in liquid helium, whereas by evaporation of liquid helium, cooling of the magnet coil is achieved such that it remains superconducting;
   a cold shield surrounding the helium vessel; and
   a single-stage Stirling cooler attached to the neck tube such that a cold head of the cooler extends into the housing and is thermally connected to the cold shield via a thermal coupling.

2. An NMR magnet system according to claim 1 wherein the magnet coil generates an equivalent field strength of 400 to 500 MHz.

3. An NMR magnet system according to claim 1 wherein the Stirling cooler provides a cooling power of at least 30 W at 80K.

4. An NMR magnet system according to claim 1 wherein the Stirling cooler is operated at a frequency above 10 Hz.

5. An NMR magnet system according to claim 1 wherein the thermal coupling comprises a flexible, thermally conductive element that mechanically isolates the Stirling cooler from the cold shield.

6. An NMR magnet system according to claim 1 wherein the NMR magnet system is a vertical NMR magnet system having a z-axis about which a room temperature bore is centered, and wherein a compressor axis of the Stirling cooler is oriented parallel to the z-axis.

7. An NMR magnet system according to claim 1 further comprising a damper located between the Stirling cooler and the cold shield to reduce transmission of vibrations from the Stirling cooler to the magnet coil.

8. A nuclear magnetic resonance (NMR) magnet system comprising:
   a housing with a neck tube;
   a helium vessel located in the housing and containing a magnet coil immersed in liquid helium;
   a cold shield surrounding the helium vessel;
   a Stirling cooler attached to the neck tube such that a cold head of the cooler extends into the housing and is thermally connected to the cold shield via a thermal coupling; and
   a damper located between the Stirling cooler and the cold shield to reduce transmission of vibrations from the Stirling cooler to the magnet coil, wherein the damper is part of an active damping system and is actively driven to compensate for the cooler movement.

9. An NMR magnet system according to claim 8 further comprising an acceleration sensor attached to the Stirling cooler that detects the movement of the Stirling cooler relative to the cold shield and provides a signal to the active damping system that is used for active driving of the damper.

10. A nuclear magnetic resonance (NMR) magnet system comprising:
    a housing with a neck tube;
    a helium vessel located in the housing and containing a magnet coil immersed in liquid helium;
    a cold shield surrounding the helium vessel;
    a Stirling cooler attached to the neck tube such that a cold head of the cooler extends into the housing and is thermally connected to the cold shield via a thermal coupling;
    an NMR probe that is inserted into a room temperature bore of the NMR magnet system, the probe providing an RF excitation signal to a sample in the magnet bore and detecting a free induction decay (FID) signal from said sample, wherein mechanical vibrations transmitted from the Stirling cooler induce a distortion in either or both of said excitation signal and FID signal; and
    a compensation apparatus that applies compensation to the excitation signal and/or FID signal that counteracts said distortion.

11. An NMR magnet system according to claim 10 wherein the compensation apparatus comprises a data storage element in which is stored a representation of said distortion.

12. An NMR magnet system according to claim 11 wherein the excitation signal is generated using a numerically controlled oscillator (NCO), and wherein applying said compensation to the excitation signal comprises providing the stored representation of said distortion as an input to the NCO.

13. An NMR magnet system according to claim 11 wherein applying said compensation to the FID signal comprises inputting the FID signal to a frequency mixer together with an oscillator signal in which is incorporated the stored representation of said distortion.

14. An NMR magnet system according to claim 10 wherein the Stirling cooler generates a periodic trigger signal indicative of a motion state of the Stirling cooler, and wherein the trigger signal is received by the compensation apparatus and used in applying said compensation to the excitation signal and/or FID signal.

15. An NMR spectrometer comprising:
    a magnet system housing with a neck tube;
    a cryogen vessel located in the housing;
    a magnet coil immersed in a cryogen located in the vessel;
    a cold shield surrounding the cryogen vessel;
    a Stirling cooler attached to the neck tube such that a cold head of the cooler extends into the housing and is thermally connected to the cold shield via a thermal coupling;
    an NMR probe that is inserted into a room temperature bore of the magnet system housing, the probe providing an RF excitation signal to a sample in the bore and detecting a free induction decay (FID) signal from the sample, wherein mechanical vibration from the Stirling cooler induces a distortion in either or both of the excitation frequency and the FID signal; and
    a compensation apparatus that applies compensation to one or both of the excitation signal and the FID signal that counteracts the distortion.

16. An NMR spectrometer according to claim 15 wherein the compensation apparatus comprises a data storage element in which is stored a representation of said distortion.

17. An NMR spectrometer according to claim 16 wherein the excitation signal is generated using a numerically controlled oscillator (NCO), and wherein applying said compensation to the excitation signal comprises providing the stored representation of said distortion as an input to the NCO.

18. An NMR magnet system according to claim 16 wherein applying said compensation to the FID signal comprises inputting the FID signal to a frequency mixer together with an oscillator signal in which is incorporated the stored representation of said distortion.

* * * * *